(12) United States Patent
Hsieh

(10) Patent No.: US 8,269,273 B2
(45) Date of Patent: Sep. 18, 2012

(54) TRENCH MOSFET WITH ETCHING BUFFER LAYER IN TRENCH GATE

(75) Inventor: Fu-Yuan Hsieh, Hsingchu (TW)

(73) Assignee: Force Mos Technology Co., Ltd., Hsinchu (TW)

( * ) Notice: Subject to any disclaimer, the term of this patent is extended or adjusted under 35 U.S.C. 154(b) by 1028 days.

(21) Appl. No.: 12/137,527

(22) Filed: Sep. 25, 2008

(65) Prior Publication Data
US 2010/0072543 A1    Mar. 25, 2010

(51) Int. Cl.
*H01L 21/336* (2006.01)

(52) U.S. Cl. .......................... 257/331; 257/330; 257/339

(58) Field of Classification Search .......... 257/328–331, 257/339, 409
See application file for complete search history.

(56) References Cited

U.S. PATENT DOCUMENTS 6,888,196 B2 * 5/2005 Kobayashi .................... 257/330
7,750,398 B2 * 7/2010 Hshieh .......................... 257/330
* cited by examiner

*Primary Examiner* — Dung A. Le
(74) *Attorney, Agent, or Firm* — Grace Lee Huang; Arch Equity Holdings, LLC

(57) ABSTRACT

The present invention is to provide a trench MOSFET with an etching buffer layer in a trench gate, comprising: a substrate which has a first surface and a second surface opposite to each other and comprises at least a drain region, a gate region, and a source region which are constructed as a plurality of semiconductor cells with MOSFET effect; a plurality of gate trenches, each of which is extended downward from the first surface and comprises a gate oxide layer covered on a inner surface thereof and a gate conductive layer filled inside, comprised in the gate region; at least a drain metal layer formed on the second surface according to the drain region; at least a gate runner metal layer formed on the first surface according to the gate region; and at least a source metal layer formed on the first surface according to the source region; wherein the gate trenches distinguished into at least a second gate trench formed at a terminal of the source region and at least a first gate trenches wrapped in the source region; and the second gate trench comprises a gate contact hole which is filled with metal to form a gate metal contact plug, and a gate buffer layer which is formed in the gate conductive layer at the bottom of the gate contact hole in the second gate trench to prevent from over etching, causing gate-drain shortage.

14 Claims, 10 Drawing Sheets

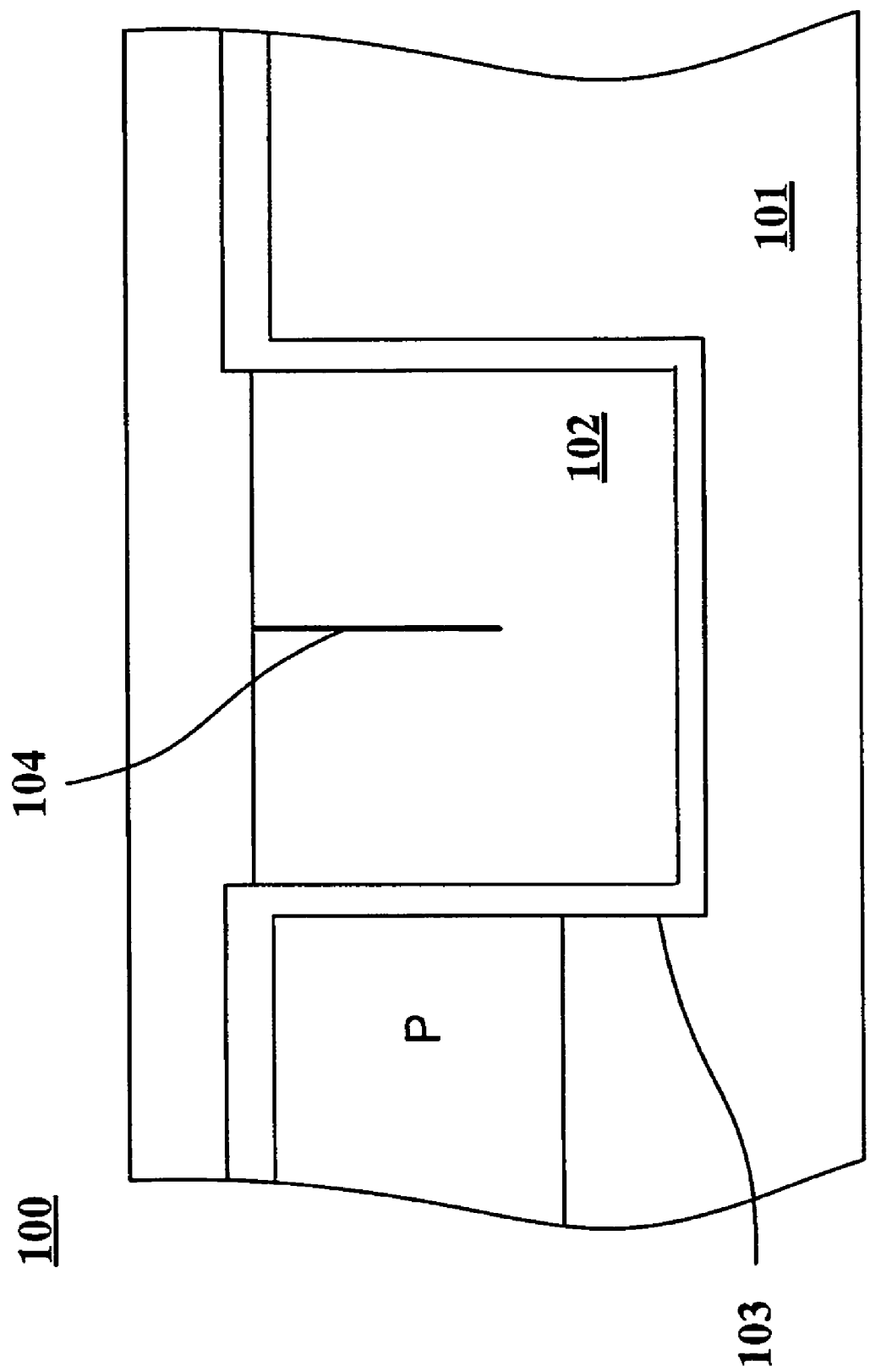
Fig. 1 (prior arts)

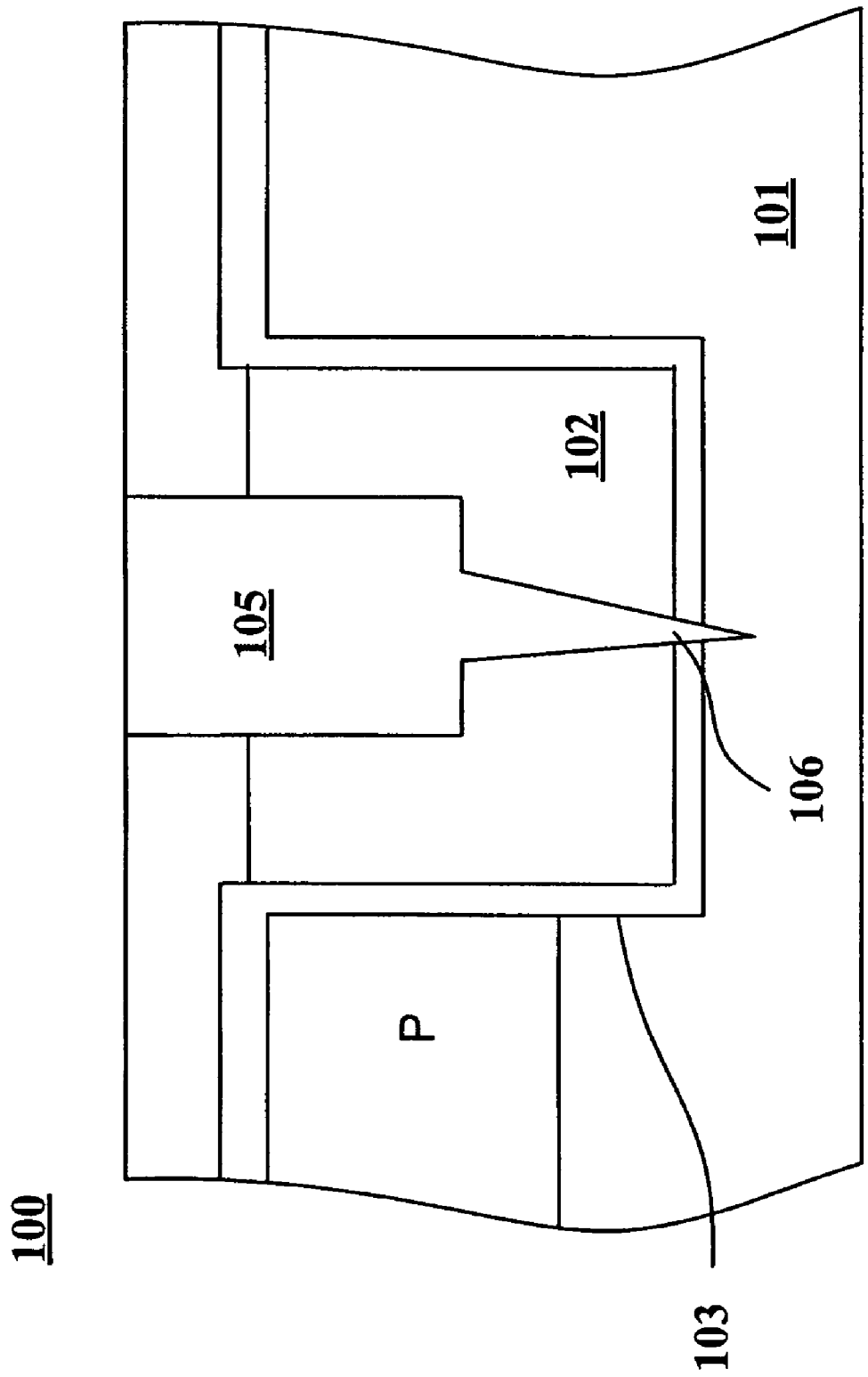
Fig. 2 (prior arts)

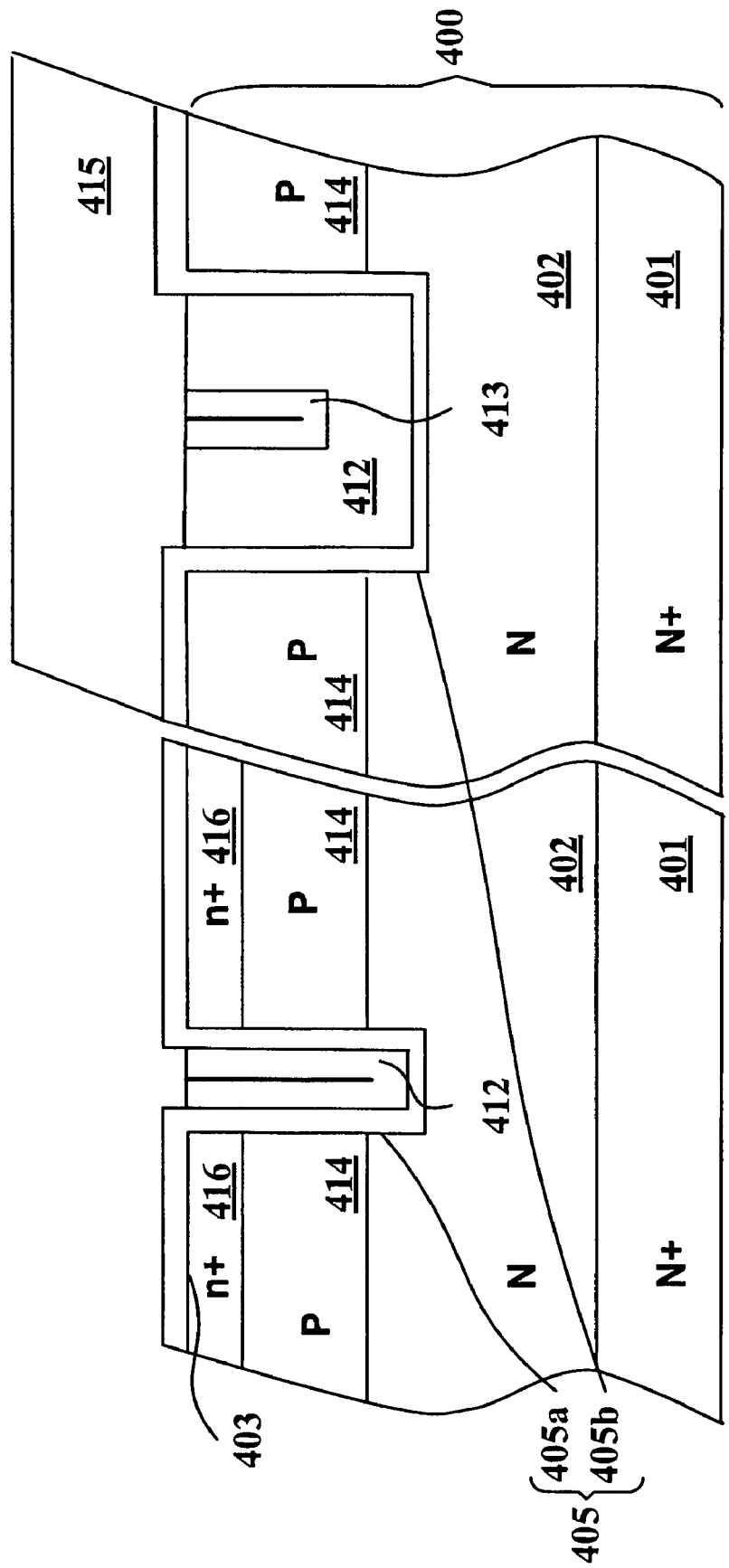

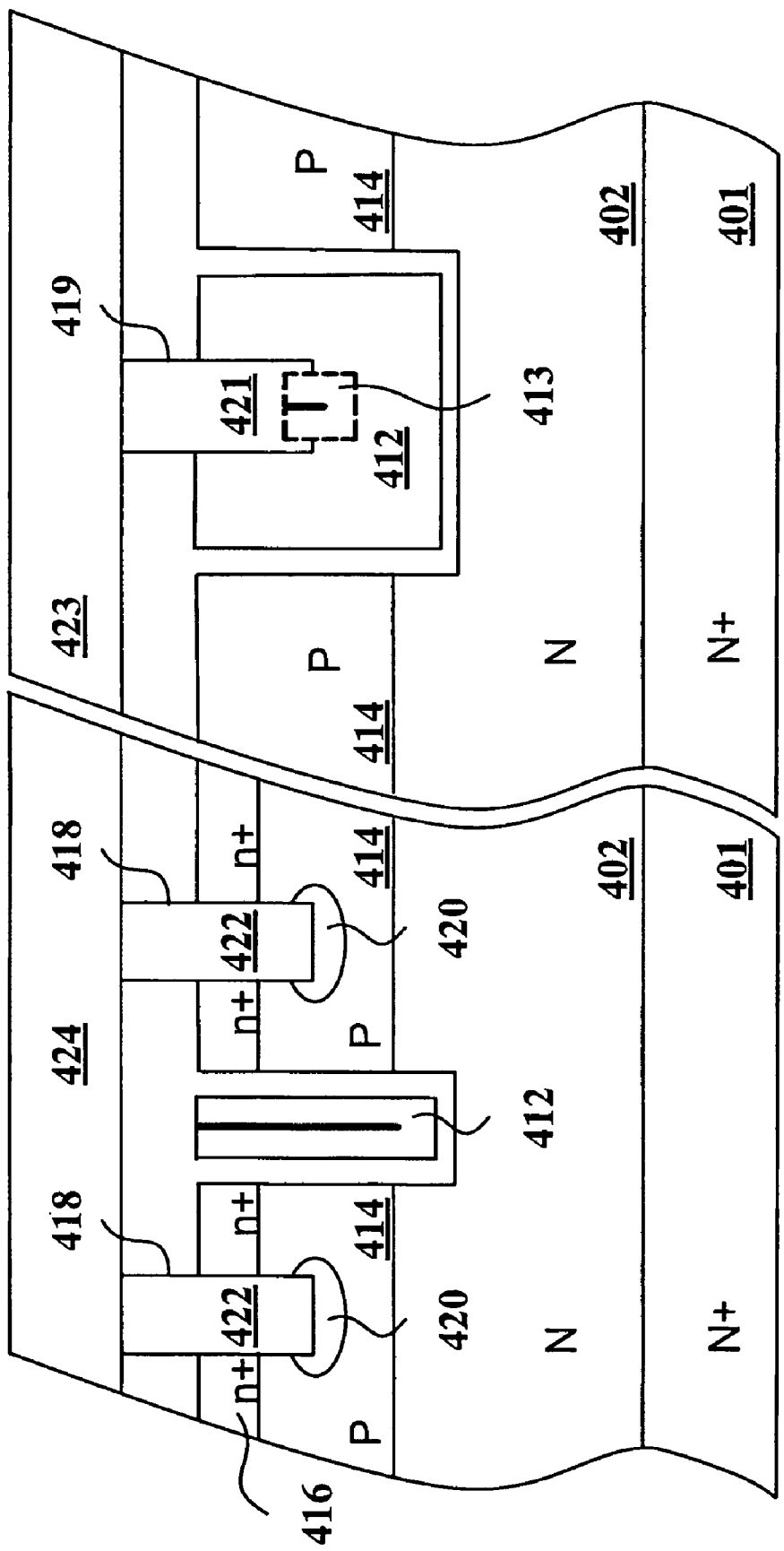

TRENCH MOSFET WITH ETCHING BUFFER LAYER IN TRENCH GATE

FIELD OF THE INVENTION

This invention relates to a trench MOSFET with an etching buffer layer in a trench gate and, in particular, to provide at least a buffer layer in the trench gate to prevent over etching from a gate trench to an epitaxial layer in the trench MOSFET and to avoid short between gate and drain.

BACKGROUND

In the structure of a trench Metal-Oxide-Semiconductor Field Effect Transistor (MOSFET) or other types of vertical MOSFET, the gate region of the transistor is formed on top of substrate, e.g. in a trench of a trenched MOSFET, and the source region and the drain region are formed on both sides of the substrate of the MOSFET, respectively. This type of vertical MOSFET allows high current to pass from the drain on backside of the substrate to the source through a channel with gate bias voltage for turning on channel region.

Referring to FIGS. 1 and 2, in the gate region of the said trench MOSFET of prior arts, a device (100) which is a semiconductor with an epitaxial layer (101) on the upper part thereof, and doped polysilicon (102) is formed in a corresponding gate trench (103). In most case, a ploy merging line (104) is formed in the middle of the gate trench (103) while the doped polysilicon (102) is deposited into and filled the gate trench (103). Before refill contact with W Plug or Al alloys, a gate contact hole (105), shown in FIG. 2, in the doped polysilicon (102) of the gate trench (103) is formed by silicon etch after contact oxide etch. However, the silicon etch for forming the gate contact hole (105) may etch through doped polysilicon (102) and gate oxide in the gate trench (103) due to heavily doped polysilicon inducing higher etch rate and the ploy merging line (104) further enhancing higher etch rate and contact the epitaxial layer (101). Therefore, the W plug or Al Alloys refilled into the gate contact trench will short through gate oxide and drain at trench bottom, causing shortage of the gate and the drain and reliability issues. The problem becomes more pronounced when the trench depth is shallower.

The present invention provides trench MOSFET with an etching buffer layer in a trench gate for gate metal contact to improves the lack of the prior art.

SUMMARY OF THE INVENTION

The invention discloses a trench MOSFET with an etching buffer layer in a trench gate for yield enhancement and reliability assurance.

Moreover, the buffer layer deposited on wafer backside simultaneously also avoids threshold voltage non-uniformity and instability across wafer and wafer to wafer due to heavily dopant outgassing from the doped poly on wafer backside. The invention resolves two above major issues encountered in prior arts without affecting gate resistance.

The present invention provides a trench MOSFET with an etching buffer layer in a trench gate, comprising: a substrate which has a first surface and a second surface opposite to each other and comprises at least a drain region, a gate region, and a source region which are constructed as a plurality of semiconductor cells with MOSFET effect; a plurality of gate trenches, each of which is extended downward from the first surface and comprises a gate oxide layer covered on a inner surface thereof and a gate conductive layer filled inside, comprised in the gate region; at least a drain metal layer formed on the second surface according to the drain region; at least a gate runner metal layer formed on the first surface according to the gate region; and at least a source metal layer formed on the first surface according to the source region; wherein the gate trenches distinguished into at least a second gate trench formed at a terminal of the source region and at least a first gate trenches wrapped in the source region and the body region; and the second gate trench comprises a gate contact hole which is filled with metal to form a gate metal contact plug, and a gate buffer layer which is formed in the gate conductive layer at the bottom of the gate contact hole in the second gate trench.

In the said second gate trench, the gate buffer layer is formed in the middle of the bottom of the gate contact hole, and the gate conductive layer has sheet resistance ranging from 6 ohm per square to 20 ohm per square while the gate buffer layer has sheet resistance larger than 25 ohm per square.

The trench MOSFET with an etching buffer layer in a trench gate of the present invention further comprises a plurality of source contact holes, each of which is extended downward from the first surface and comprises a source metal plug electrically connected with source metal layer, and the gate metal contact plug is selected from tungsten, aluminum or copper alloys.

The said substrate further comprises a first type semiconductor layer and an epitaxial layer formed on the first type semiconductor layer to perform the drain region, a plurality of body layers which are second type semiconductor formed on a plurality of upper parts of the epitaxial layer and among the first and second gate trenches, and a plurality of source layers which are first type semiconductor formed on the corresponding body layers in active area or source area which has current passes through from drain to source; the source layers have higher doping concentration than the epitaxial layer; the each type body layer and the corresponding source layer are performed the source region; and the source region comprised the body layers and the corresponding source layers are formed among the first gate trenches and insulated from the gate conductive layer by the gate oxide layer to perform source region. Besides, the first surface of the substrate has an insulating layer which is an oxide layer for insulating the first surface from the gate runner metal layer and the source metal layer. Moreover, a contact part which is a second type semiconductor formed to wrap a bottom of the each corresponding source contact hole; and the contact part has higher second type semiconductor doped concentration than the body layer.

The trench MOSFET with an etching buffer layer in a trench gate of the present invention further comprises at least a drain metal layer formed on the second surface according to the drain region.

The trench MOSFET with an etching buffer layer in a trench gate of the present invention is also under a particular method comprising: providing a silicon substrate comprised an epitaxial layer and a semiconductor layer, which are first type semiconductor, while the semiconductor layer has higher first type semiconductor doped concentration than the epitaxial layer; forming a plurality of gate trenches in the epitaxial layer, which has a top surface defined as a first surface; forming an gate oxide layer on the surface of the each gate trench for using as a gate oxide; forming a first polysilicon layer by a heavily doped polysilicon deposition to fill the gate trench and to remain a space in the middle of at least one of the gate trenches; forming a second polysilicon layer by a less doped or undoped polysilicon deposition than the first polysilicon layer to fully refill the apace of the corresponding gate trench; forming a plurality of body regions, each of which is formed beside the corresponding gate trench in the epitaxial layer; forming a plurality of source regions in the active area, each of which is formed on the top of the body region; forming an insulating layer, an other oxide film, on the first surface of the substrate; forming a plurality of contact openings defined as at least a source contact hole according to the source region and the body region and at least a gate contact hole according to the gate trench which has the second polysilicon layer inside; forming a plurality of metal layers in the each source contact hole corresponding to the source regions and the each gate contact hole at the part corresponding to the second polysilicon layer in the gate trench; and forming a source metal layer on the first surface according to the source region for electrically connecting the metal layers in the corresponding source contact hole and a gate runner metal layer on the first surface according to the gate region for electrically connecting the metal layer in the corresponding gate contact hole.

The said method further comprises forming at least a drain metal layer on the bottom surface of the epitaxial layer.

The said less doped polysilicon deposition using in the forming a second polysilicon layer process can also be selected form an undoped polysilicon deposition.

The said forming a plurality of source regions process further comprises forming a plurality of body layers with second type semiconductor among the gate trenches in the epitaxial layer; forming source layer with first type semiconductor doping on the corresponding body layer among the gate trenches in active area while the source layer has heavily doping concentration than the epitaxial layer.

The said forming a plurality of source regions process further comprises forming a contact part with second type semiconductor at a bottom of the each source contact hole while the contact part has heavily doping concentration than the body layer.

The said gate trench which has the second polysilicon layer inside is formed at a terminal of the source region.

BRIEF DESCRIPTION OF THE DRAWINGS

The present invention can be more fully understood by reading the following detailed description of the preferred embodiments, with reference made to the accompanying drawings, wherein:

FIG. 1 is a sectional view of trench MOSFET without an etching buffer layer in a trench gate for gate metal contact according to prior arts;

FIG. 2 is another sectional view of trench MOSFET of prior art without an etching buffer layer in a trench gate for gate metal contact, showing metal plug shortage with drain through poly merging line according to prior arts;

Referring to FIGS. 4A, 4B, 5A, 5B, 6A, 6B, 7A, 7B, 8A, 8B, 9A, and 9B is a sectional view of trench MOSFET with an etching buffer layer in a trench gate and under manufacturing process according to the present invention.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Figure 3A:
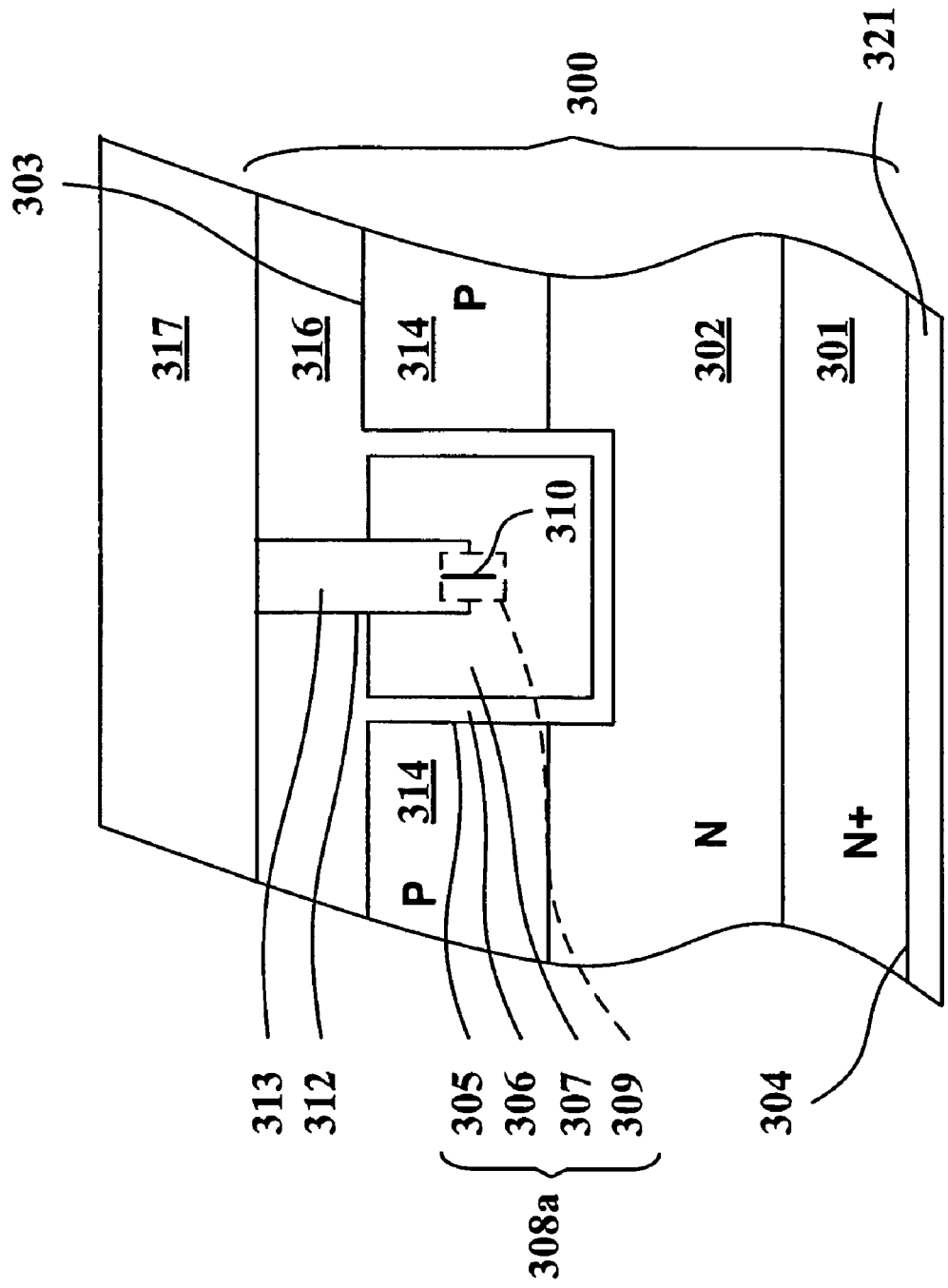
FIG. 3A is a sectional view of trench MOSFET with an etching buffer layer in a trench gate according to the present invention.
Figure 3B:
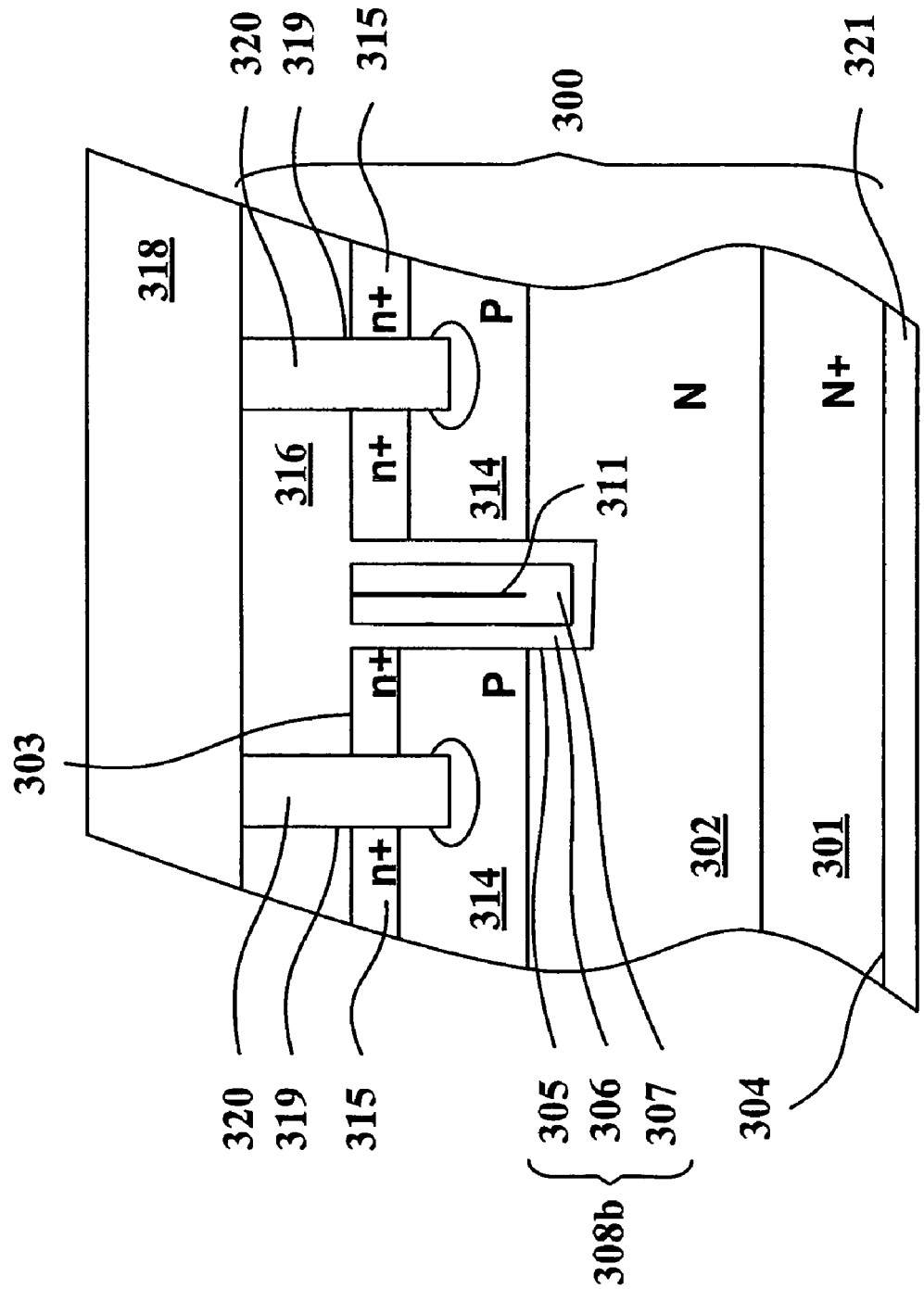
FIG. 3B is another sectional view of trench MOSFET in active area without an etching buffer layer in a trench gate according to the present invention.

Referring to FIGS. 3A and 3B, the FIG. 3A is a sectional view according to a part of a trench MOSFET in trench gate contact area with the first doped poly and the etching buffer layer in a trench gate of the present invention, and the FIG. 3B is a sectional view according to another part of the trench MOSFET in active area with the first doped poly but without the etching buffer layer in the trench gate of the present invention. In the present invention, a substrate (300) comprises at least a drain region, a gate region, and a source region, which are constructed as a plurality of semiconductor cells with MOSFET effect.

The said substrate (300) shown in FIG. 3A comprises an $N^+$-type semiconductor layer (301), a layer with heavily n-type doping, and an N-type epitaxial layer (302). The N-type epitaxial layer (302) is formed on the $N^+$-type semiconductor layer (301) to constitute the said drain region and to perform the drain effect in MOSFET. In an embodiment, the $N^+$-type semiconductor layer (301) is formed at a lower part of the substrate (300) and is an epitaxial layer with more n-type doping concentration than the N-type epitaxial layer (302), and the substrate (300) have a first surface (303) and a second surface (304) opposite to each other while the first surface (303) is the top surface of the N-type epitaxial layer (302) and the second surface (304) is the lower surface of the $N^+$-type semiconductor layer (301). The second surface (304) has a drain metal layer (321), which is formed on the second surface (304) and can be made of metal or an electrically conductive alloy, for a drain electrode in the MOSFET.

A plurality of gate trenches (305), each one is a cavity extended downward from the first surface (303) through the N-type epitaxial layer (302) to an optimum depth, are respectively lain gate oxide layers (306), each one is an oxide layer, thereon and filled gate conductive layers (307) therein. The each gate oxide layer (306) is covered the surface of the corresponding gate trench (305) and wraps the circumference of the gate conductive layer (307) for insulating from the source region of the MOSFET in particular, and the gate conductive layer (307) is a doped polysilicon layer as an electrically conducting medium in the gate region of the MOSFET. Therefore, the gate trenches (305), the gate oxide layers (306), and the gate conductive layers (307) are constituted a plurality of trench gates corresponding to the gate trenches (305) and performed as the gate region of the MOSFET.

The said trench gates are distinguished into at least a second trench gate (308a), which is formed at a terminal of the source region of the MOSFET, and a plurality of first trench gates (308b) which are wrapped in the source region and the body region of the MOSFET in active area. In particular, the each second trench gate (308a) shown in FIG. 3A has a gate buffer layer (309) which is formed in the first gate conductive layer (307) of the second trench gate (308a), and a second ploy merging line (310) which is formed in the gate buffer layer (309). The each first trench gate (308b) shown in FIG. 3B has a first ploy merging line (311) which is formed due to the deposition process of the gate conductive layer (307) since the gate conductive layer (307) grows to thicker and seams in the corresponding gate trench (305). Moreover, the gate buffer layer (309) is an undoped polysilicon layer or a lightly doped polysilicon layer which is a polysilicon layer formed with less doping of polysilicon than the gate conductive layer (307) so that the etching rate of the gate conductive layer (307) is faster than the etching rate of the gate buffer layer (309) during a polysilicon etching process.

In the said each gate trench (305) of the corresponding second trench gate (308a), the gate buffer layer (309) wraps the second ploy merging line (310). A gate contact hole (312) is formed to extend downward to contact the corresponding gate conductive layer (307) and the corresponding gate buffer layer (309) from the first surface (303) of the substrate (300), and the each gate contact hole (312) is fill up metal to form a gate metal contact plug (313). In a best embodiment, the each gate contact hole (312) in the gate trench (305) of the corresponding second trench gate (308a) is wider than the gate buffer layer (309) in the same second trench gate (308a), and the each gate metal contact plug (313) contacts and wraps an upper part of the corresponding gate buffer layer (309) because the etching rate of the gate conductive layer (307) is faster than the etching rate of the gate buffer layer (309) during a polysilicon etching process. Therefore, the lower part of the second ploy merging line (310) is wrapped in the gate buffer layer (309).

In a best embodiment, the said gate conductive layer (307) has sheet resistance ranging from 6 ohm per square to 20 ohm per square, and the gate buffer layer (309) has sheet resistance larger than 25 ohm per square.

The substrate (300) has a plurality of P-type body layers (314) which are P-type semiconductor formed on a plurality of upper parts of the N-type epitaxial layer (302) and among the first trench gates (308b), and a plurality of N$^+$-type source layers (315) which are N-type semiconductor formed on the corresponding P-type body layers (314). The N$^+$-type source layers (315) have higher doping concentration than the N-type epitaxial layer (302). The each P-type body layer (314) and the corresponding N$^+$-type source layer (315) constitute a source region and a body region of the MOSFET. The source regions comprised the P-type body layers (314) and the corresponding N$^+$-type source layers (315) are formed among the first trench gates (308b) and insulated from the gate conductive layer (307) by the gate oxide layer (306) to perform source effect in MOSFET.

Referring to FIGS. 3A and 3B, the first surface (303) of the substrate (300) has an insulating layer (316) which is an oxide layer for insulating the first surface (303) of the substrate (300).

Referring to FIGS. 3A again, corroding to the each second trench gate (308a), a gate runner metal layer (317), which can be made of metal or an electrically conductive alloy, is formed on the top surface of the insulating layer (316) according to the second trench gate (308a) and contacts to the gate conductive layer (307) and the gate buffer layer (309) by the gate metal contact plug (313) to connect electrically to the trench gate (308a).

In the each second trench gate (308a), a gate contact hole (312) can be penetrated from the top surface of the insulating layer (316), through the insulating layer (316) covered on the corresponding second trench gate (308a), and extended in the corresponding the gate conductive layer (307) to contact the top of the gate buffer layer (309). In the each gate contact hole (312), a gate metal contact plug (313), which can be made of metal or an electrically conductive alloy, is filled in the gate contact hole (312) to connect the gate conductive layer (307) and the gate buffer layer (309).

Referring to FIG. 3B again, corroding to the each source region, a source metal layer (318), which can be made of metal or an electrically conductive alloy, is formed on the top surface of the insulating layer (316) according to the P-type body layers (314) and the N$^+$-type source layers (315) and connected electrically to the P-type body layers (314) and the N$^+$-type source layers (315).

In the each source region, a source contact hole (319) can be penetrated from the top surface of the insulating layer (316) and through the insulating layer (316) and the corresponding N$^+$-type source layer (315) to contact the corresponding P-type body layer (314), and a source metal plug (320), which can be made of metal or an electrically conductive alloy, is filled in the source contact hole (319) to connect the P-type body layer (314) and the N$^+$-type source layer (315) in ohmic contact.

The gate metal contact plug (313) is selected from tungsten, aluminum or metal alloys, and the source metal plug (320) is also.

In order to achieve the trench gate structures as shown in FIGS. 3A and 3B, a correlation between trench widths and a doped poly thickness of the gate conductive layer (307) is required. The doped poly thickness of the gate conductive layer (307) must between the half trench width of the second trench gate (308a) and the half trench width of the each first trench gate (308b) while the trench width of the second trench gate (308a) is wider than twice the trench width of the each first trench gate (308b). Therefore, the gate trench (305) of the each first trench gate (308b), a narrower trench in FIG. 2B, is fully refilled with the gate conductive layer (307), a doped polysilicon, while the gate trench (305) of the second trench gate (308a), a wider trench in FIG. 3A, is partially refilled with the gate conductive layer (307), the doped polysilicon, and then fully refilled with the gate buffer layer (309), a undoped polysilicon or a less doped polysilicon. With such structures, a gate resistance in the active region mainly determined by sheet resistance of the gate conductive layer (307) in the first trench gate (308b), the doped polysilicon in the narrow trench, is maintained without any change while the gate-drain shortage issue is avoided due to the gate trench (305) of the second trench gate (308a), the wider trench, refilled with both the gate conductive layer (307) which is the doped poly and the gate buffer layer (309) for etching buffer.

Referring to FIGS. 4A, 4B, 5A, 5B, 6A, 6B, 7A, 7B, 8A, and 8B, description will be made of a method of producing a trench MOSFET with an etching buffer layer in a trench gate according to an embodiment of the present invention.

Figures 4A, 4B:
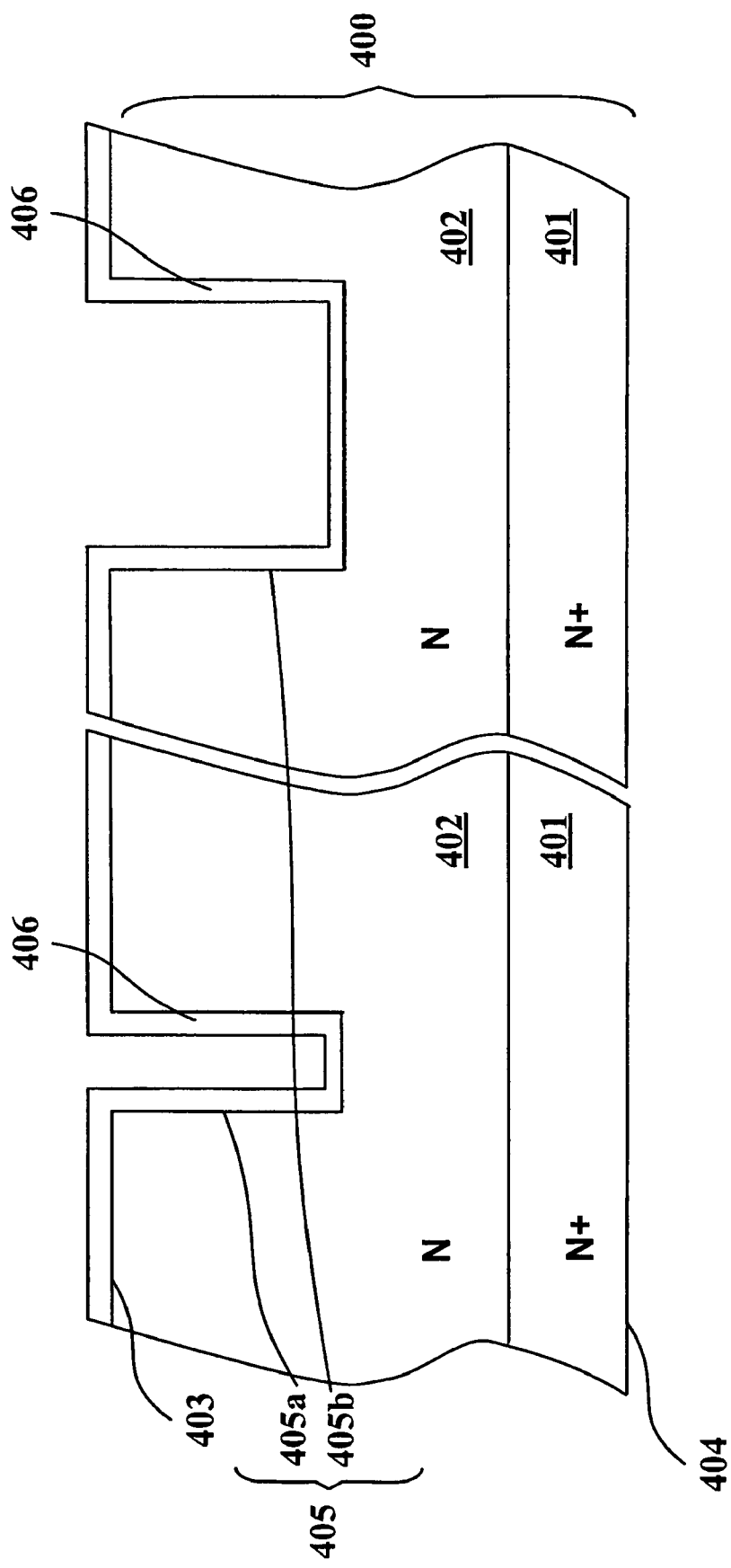

Referring to FIGS. 4A and 4B, a substrate (400) which is a silicon substrate comprises an N$^+$-type semiconductor layer (401) which is heavily n-doped and haves an N-type epitaxial layer (402) which is heavily n-doped thereon. The substrate (400) have a first surface (403) and a second surface (404) opposite to each other while the first surface (403) is the top surface of the N-type epitaxial layer (402) and the second surface (404) is the lower surface of the N$^+$-type semiconductor layer (401). A trench mask is applied on the first surface (403), and Lithography and silicon etching processes are performed to form a plurality of gate trenches (405) in the N-type epitaxial layer (402). Besides, the said gate trenches (405) are distinguished into at least a second gate trench (405b), which is formed at a terminal of the source region of the MOSFET, and a plurality of first gate trenches (405a) which are wrapped in the source region of the MOSFET. Thereafter, the trench mask, the said sacrificial oxide layer is grown and then removed by wet etching. The depth and the width of each gate trench (405) and the distance between the adjacent gate trenches (405) must be selected to optimum sizes because the breakdown voltage and the on-resistance characteristic of the MOSFET depend thereupon. However, these sizes are also related to the state of formation of an impurity diffusion layer and have some degrees of freedom.

Then, a gate oxide layer (406) is formed to cover on the first surface (403) of the substrate (400) and the surface of the each gate trench (405).

Figures 5A, 5B:
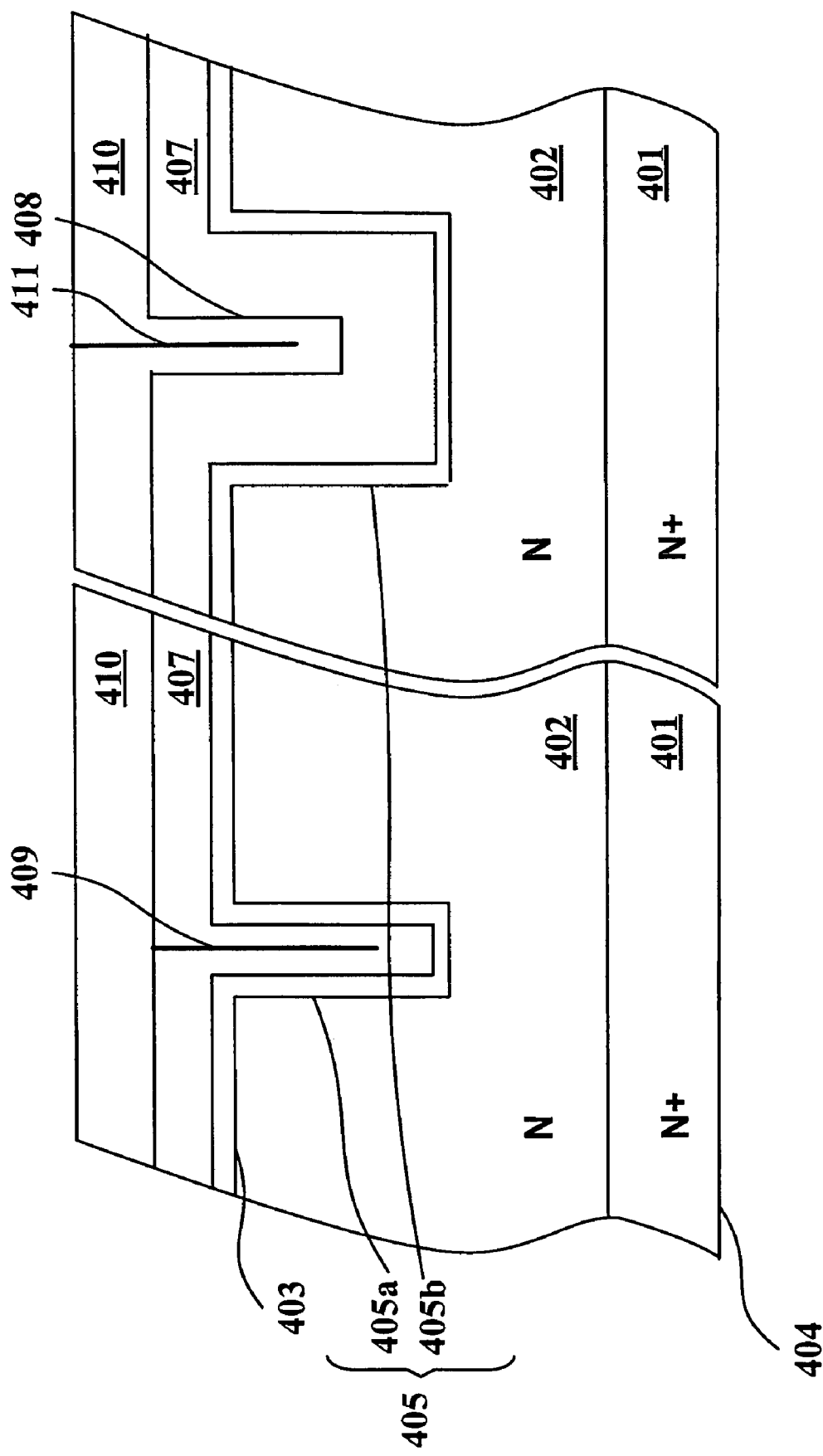

Referring to FIGS. 5A and 5B, a first polysilicon layer (407) is formed by a heavily doped polysilicon deposition with optimized thicknesses to partly fill the second gate trench (405b) and fully fill the first gate trench (405a) so that a space (408) is formed in the middle of the second gate trench (405b) and a first ploy merging line (409) is formed in the first polysilicon layer (407) corresponding to the each first gate trench (405a) due to the mergence of the first polysilicon layer (407) in the corresponding first gate trench (405a). Then, a second polysilicon layer (410) is formed by an undoped polysilicon deposition or a less doped polysilicon deposition to fully refill the space (408) in the second gate trench (405b), and a second ploy merging line (411) is formed in the second polysilicon layer (410) corresponding to the each second gate trench (405b) due to the mergence of the second polysilicon layer (410) in the space (408). The second polysilicon layer (410) is formed with an undoped polysilicon or a less doped polysilicon than the first polysilicon layer (407).

Figures 6A, 6B:
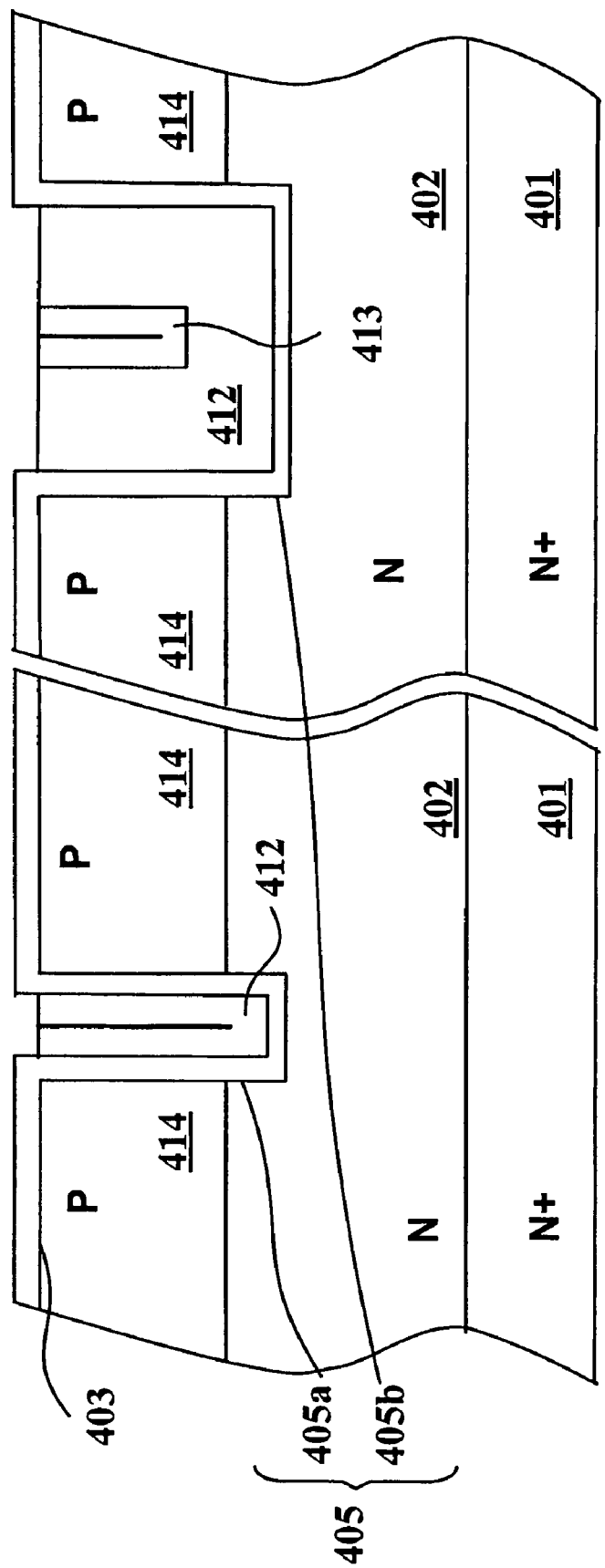

Referring to FIGS. 6A and 6B, the first polysilicon layer (407) and the second polysilicon layer (410) shown in the FIGS. 5A and 5B are etched back, and the parts of the first polysilicon layer (407) and the second polysilicon layer (410) filled in the gate trenches (405) are reserved after the other part of the first polysilicon layer (407) and the other part of the second polysilicon layer (410) covered on the first surface (403) are removed. Therefore, the each residual part of the first polysilicon layer (407) is defined as a gate conductive layer (412) and the each residual part of the second polysilicon layer (410) is defined as a gate buffer layer (413). On the other words, the each second gate trench (405b) is filled with the gate conductive layer (412) and the gate buffer layer (413), and the first gate trench (405a) is filled with the gate conductive layer (412) with heavily doped poly only, keeping same gate resistance Rg as prior arts. A P-type semiconductor doping process is performed into the N-type epitaxial layer (402) from the first surface (403) side to form a plurality of P-type body layers (414) among the gate trenches (405) in the N-type epitaxial layer (402) shown in FIGS. 5A and 5B. During the P-type semiconductor doping process, the gate conductive layer (412) and the gate buffer layer (413) block the P-type semiconductor doping so that the each P-type body layer (414) is formed in the N-type epitaxial layer (402) and beside of the gate trenches (405).

Referring to FIGS. 7A and 7B, a source mask (415) is formed on the first surface (403) of the substrate (400) to define an N-type semiconductor doping regions. Thereafter, an N-type semiconductor doping process is performed into the P-type body layer (414) from the first surface (403) side to form a plurality of the $N^+$-type source layer (416) among the gate trenches (405) in the P-type body layers (414), and the $N^+$-type source layer (416) has much heavier doping concentration than the N-type epitaxial layer (402). During the N-type semiconductor doping process, the gate conductive layer (412) and the source mask (415) block the N-type semiconductor doping so that the each $N^+$-type source layer (416) is formed in the corresponding P-type body layer (414) beside the corresponding first gate trench (405a).

Figures 8A, 8B:
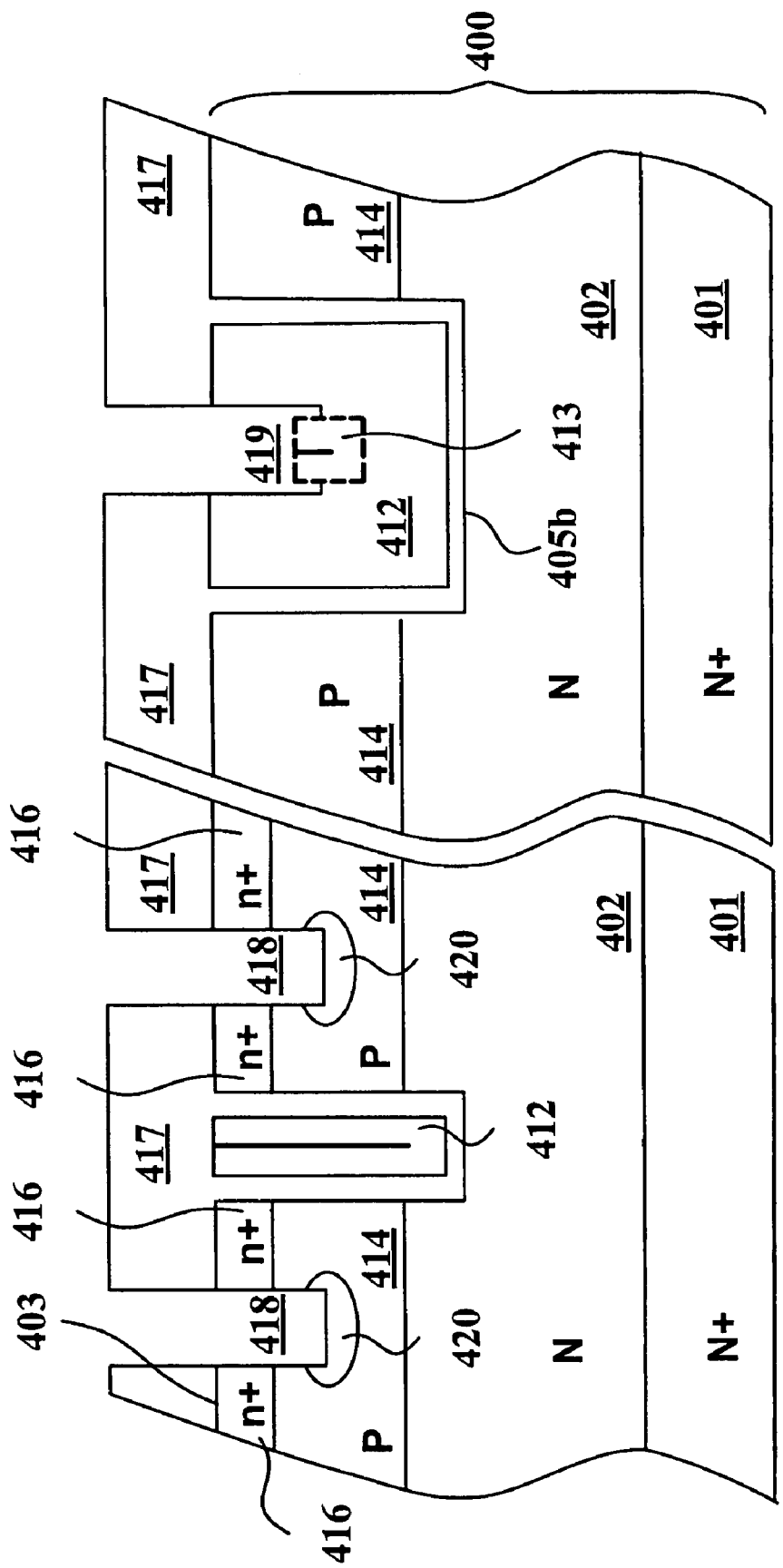

Referring to FIGS. 8A and 8B, an oxide deposition process is performed to form an insulating layer (417) which is an oxide film on the first surface (403) of the substrate (400). Thereafter, a contact mask (not shown) is defined a plurality of etching regions to carry out a contact etch, which is applied by an dry oxide etching process and a silicon etching process thereafter, and then a plurality of contact openings defined as a plurality of source contact holes (418) and at least a gate contact hole (419) are formed. The each source contact hole (418) is formed by the oxide etching process to etch through the corresponding insulating layer (417), and by the silicon etching process to etch through the corresponding $N^+$-type source layer (416) and penetrate into corresponding P-type body layer (414) after the oxide etching. The gate contact hole (419) is formed by the oxide etching process to etch through the corresponding insulating layer (417), and by the silicon etching process to penetrate into the corresponding gate conductive layer (412) and the corresponding gate buffer layer (413) in the second gate trench (405b) after the oxide etching.

Furthermore, due to the silicon etching process, the each gate contact hole (419) extends into the corresponding gate conductive layer (412) and reaches the corresponding gate buffer layer (413) in the second gate trench (405b). Because the gate buffer layer (413) is selected from a undoped polysilicon layer or a lightly doped polysilicon layer with less doping of polysilicon than the gate conductive layer (412) and although the first ploy merging line (409) of the gate buffer layer (413) enhances the etching rate in the gate buffer layer (413), the etching rate of the gate buffer layer (413) is still slower than the etching rate of the gate conductive layer (412). Therefore, the bottom of the each second gate trench (405b) is prevented form an over etching due to the first ploy merging line (409) in middle of the corresponding second gate trench (405b) by the gate buffer layer (413) which has the slower etching rate. Finally, in the second gate trench (405b), the gate buffer layer (413) bucks at the bottom thereof, and the middle bottom of the second gate trench (405b) is not etched over the interface of the bottom thereof and the gate conductive layer when the silicon etching process stops in the second gate trench (405b).

Besides, a P-type semiconductor doping process is additionally performed into a bottom of the each source contact hole (418) from the first surface (403) side to form a $P^+$-type contact part (420) to wrap the bottom of the corresponding source contact hole (418) since the $P^+$-type contact part (420) has higher p-doped concentration than the P-type body layer (414) to achieve ohmic contact to trench metal plug (422).

Referring to FIGS. 9A and 9B, after forming the $P^+$-type contact part (420), a metal layer which is selected from one of Ti (titanium), TiN (titanium nitride), or synthetic of Ti and TiN, is deposited into the each gate contact hole (419) and each source contact hole (418) and on the surface of the insulating layer (417), and then etch back. Therefore, the gate contact hole (419) is filled with the gate metal contact plug (421), and the source contact hole (418) is filled with the source metal plug (422). The gate runner metal layer (423) and source metal (424) such as Aluminum alloys or Copper are electrically connected to the gate metal contact plug (421) and the source metal plug (422), respectively.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A trench MOSFET with an etching buffer layer in a trench gate, comprising:
    a substrate which has a first surface and a second surface opposite to each other and comprises at least a drain region, a gate region, and a source region which are constructed as a plurality of semiconductor cells with MOSFET effect;

a plurality of gate trenches, each of which is extended downward from the first surface and comprises a gate oxide layer covered on a inner surface thereof and a gate conductive layer, a doped polysilicon, filled inside, comprised in the gate region;

at least a gate runner metal layer formed on the first surface according to the gate region; and at least a source metal layer formed on the first surface according to the source region;

wherein the gate trenches distinguished into at least a first gate trench wrapped in the source region, and at least a second gate trench formed at a terminal of the source region for gate metal contact; and the second gate trench comprises a gate contact hole which is filled with metal to form a gate metal contact plug electrically connected with the gate runner metal layer, and a gate buffer layer which is formed at where is corresponding to the gate contact hole in the gate conductive layer of the second gate trench and is selected from a undoped polysilicon layer or a lightly doped polysilicon layer with less doping of polysilicon than the gate conductive layer, wherein the trench width of the second gate trench at the terminal of the source region is wider the first gate trench in source region.

2. The trench MOSFET of claim 1, wherein the first gate trench is fully filled with the gate conductive layer while the second gate trench is partially filled with the gate conductive layer; and the gate buffer layer is deposited in the second gate trench after the gate conductive layer.

3. The trench MOSFET of claim 1, wherein the gate conductive layer is heavily doped polysilicon.

4. The trench MOSFET of claim 1, wherein the gate buffer layer is formed at the bottom of the gate contact hole in the gate conductive layer of the second gate trench.

5. The trench MOSFET of claim 1, wherein the gate buffer layer is formed in the middle of the second trench gate for the gate metal contact plug.

6. The trench MOSFET of claim 1, wherein the gate metal contact plug and source metal contact plug are selected from tungsten, aluminum alloys or copper.

7. The trench MOSFET of claim 1, wherein the gate conductive layer has sheet resistance ranging from 6 ohm per square to 20 ohm per square.

8. The trench MOSFET of claim 1, wherein the gate buffer layer has sheet resistance larger than 25 ohm per square.

9. The trench MOSFET of claim 1, wherein further comprises a plurality of source contact holes, each of which is extended downward from the first surface and comprises a source metal plug electrically connected with source metal layer.

10. The trench MOSFET of claim 8, wherein the source metal plugs are selected from tungsten, aluminum or metal alloys.

11. The trench MOSFET of claim 1, wherein the substrate further comprises a first type semiconductor layer and an epitaxial layer formed on the first type semiconductor layer to perform the drain region, a plurality of body layers which are second type semiconductor formed on a plurality of upper parts of the epitaxial layer and among the first gate trenches, and a plurality of source layers which are first type semiconductor formed on the corresponding body layers; the source layers have higher doping concentration than the epitaxial layer; the each type body layer and the corresponding source layer are performed the source region; and the source region comprised the body layers and the corresponding source layers are formed among the first gate trenches and insulated from the gate conductive layer by the gate oxide layer to perform source region.

12. The trench MOSFET of claim 11, wherein the first surface of the substrate has an insulating layer which is an oxide layer for insulating the first surface from the gate runner metal layer and the source metal layer.

13. The trench MOSFET of claim 11, wherein a contact part which is a second type semiconductor formed to wrap a bottom of the each corresponding source contact hole; and the contact part has higher second type semiconductor doped concentration than the body layer.

14. The trench MOSFET of claim 1, wherein further comprises at least a drain metal layer formed on the second surface according to the drain region.

* * * * *